(12) United States Patent
Kagan et al.

(10) Patent No.: US 7,616,433 B2
(45) Date of Patent: Nov. 10, 2009

(54) CURRENT INPUTS INTERFACE FOR AN ELECTRICAL DEVICE

(75) Inventors: Erran Kagan, Great Neck, NY (US); Tibor Banhegyesi, Baldwin, NY (US); Avi Cohen, Great Neck, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 0 days.

(21) Appl. No.: 12/271,360

(22) Filed: Nov. 14, 2008

(65) Prior Publication Data

US 2009/0154071 A1 Jun. 18, 2009

Related U.S. Application Data

(63) Continuation of application No. 11/894,931, filed on Aug. 22, 2007, now Pat. No. 7,453,684, which is a continuation of application No. 11/003,064, filed on Dec. 3, 2004, now Pat. No. 7,271,996.

(51) Int. Cl.
*G06F 19/00* (2006.01)

(52) U.S. Cl. ............ 361/664; 361/659; 361/663; 361/668; 702/60

(58) Field of Classification Search ............ 361/601, 361/659, 661, 663, 664, 668, 669, 62, 79, 361/86, 88, 603, 673; 702/60, 57, 58, 61, 702/187, 189; 324/76.11, 103 R
See application file for complete search history.

(56) References Cited

U.S. PATENT DOCUMENTS

| | | | | |
|---|---|---|---|---|
| 4,258,348 A | | 3/1981 | Belfer et al. | |
| 4,288,768 A | | 9/1981 | Arnhold et al. | |
| 4,484,021 A | * | 11/1984 | Schaefer et al. | 174/53 |
| 5,561,376 A | * | 10/1996 | Moore et al. | 324/713 |
| 5,563,506 A | * | 10/1996 | Fielden et al. | 324/142 |
| 5,631,569 A | * | 5/1997 | Moore et al. | 324/713 |
| 6,292,717 B1 | * | 9/2001 | Alexander et al. | 700/293 |
| 6,329,810 B1 | | 12/2001 | Reid | |
| 6,373,238 B2 | * | 4/2002 | Lewis et al. | 324/107 |
| 6,429,637 B1 | * | 8/2002 | Gandhi | 324/74 |
| 6,429,785 B1 | * | 8/2002 | Griffin et al. | 340/870.02 |
| 6,470,283 B1 | * | 10/2002 | Edel | 702/64 |
| 6,636,030 B1 | | 10/2003 | Rose et al. | |
| 6,735,535 B1 | | 5/2004 | Kagan et al. | |
| 6,751,563 B2 | | 6/2004 | Spanier et al. | |
| 6,798,190 B2 | | 9/2004 | Harding et al. | |
| 6,798,191 B1 | | 9/2004 | Macfarlane et al. | |
| 6,838,867 B2 | | 1/2005 | Loy | |
| 6,891,725 B2 | | 5/2005 | Derksen | |
| 6,957,158 B1 | * | 10/2005 | Hancock et al. | 702/61 |

(Continued)

*Primary Examiner*—Michael V Datskovskiy
(74) *Attorney, Agent, or Firm*—Gerald E. Hespos; Anthony J. Casella; Michael J. Porco (57) ABSTRACT

According to an aspect of the present disclosure, an electrical power meter, is disclosed. The electrical power meter includes a housing for containing electrical circuitry therein, the housing including at least one of voltage and current inputs, the housing including passages extending entirely therethrough, wherein the passages are configured to receive a CT lead therethrough, and wherein the CT leads are not electrically connected to the electrical circuitry therein; and a face plate operatively supported on a surface of the housing, wherein the face plate includes at least one of displays, indicators and buttons. It is envisioned that the through passages are located along a side of the housing.

20 Claims, 12 Drawing Sheets

U.S. PATENT DOCUMENTS

| | | |
|---|---|---|
| 6,989,667 B2 | 1/2006 | Loy |
| 7,010,438 B2 * | 3/2006 | Hancock et al. ............... 702/60 |
| 7,072,779 B2 * | 7/2006 | Hancock et al. ............... 702/60 |
| 7,089,089 B2 * | 8/2006 | Cumming et al. ........... 700/295 |
| 7,116,538 B2 | 10/2006 | Haensgen et al. |
| 7,158,050 B2 * | 1/2007 | Lightbody et al. ...... 340/870.02 |
| 7,161,455 B2 | 1/2007 | Tate et al. |
| 7,174,261 B2 * | 2/2007 | Gunn et al. .................... 702/62 |
| 7,265,533 B2 * | 9/2007 | Lightbody et al. ........ 324/158.1 |
| 2006/0066456 A1 | 3/2006 | Jonker et al. |
| 2006/0202858 A1 | 9/2006 | Holle et al. |

* cited by examiner

FIG. 11B

CURRENT INPUTS INTERFACE FOR AN ELECTRICAL DEVICE

This application is a continuation application of U.S. application Ser. No. 11/894,931, filed Aug. 22, 2007, which is a continuation application of U.S. application Ser. No. 11/003,064, filed Dec. 3, 2004, entitled "Current inputs interface for an electrical device", the contents of both of which are incorporated by reference in their entirety.

BACKGROUND OF THE INVENTION

1. Technical Field

The present disclosure relates to electrical devices and/or power meters and, more particularly, to electrical devices, including electrical power meters, having current input interfaces.

2. Background of Related Art

Electric utility companies track electric usage by customers by using power meters. These meters track the amount of power consumed at a particular location. These locations range from power substations, to commercial businesses, to residential homes. The electric utility companies use the power meter to charge its customers for their power consumption, i.e. revenue metering.

A popular type of power meter is the socket-type power meter. As its name implies, the meter itself plugs into a socket for easy installation, removal and replacement. Other meter installations include panel mounted, switchboard mounted, and circuit breaker mounted. Typically the power meter connects between utility power lines supplying electricity and a usage point, namely a residence or commercial place of business. Though not typical, a power meter may also be placed at a point within the utility's power grid to monitor power flowing through that point for distribution, power loss, or capacity monitoring. Also, power meters can be used to monitor internal customer usage that handle submetering functions.

Traditionally, power meters used mechanical means to track the amount of consumed power. The inductive spinning disk power meter is still commonly used. The spinning disk drives mechanical counters that track the power consumption information.

Newer to the market are electronic power meters. Electronic meters have replaced the older mechanical meters, and utilize digital sampling of the voltage and current waveforms to generate power consumption information. In addition to monitoring power consumption, electronic meters can also monitor and calculate power quality, that is, voltage, current, real power, reactive power, and apparent power, among others. These power quality measurements and calculations are displayed on an output display device on the meter.

In more recent developments, limited power consumption information can be transmitted from the power meter to the utility through the use of telephone communications circuitry contained either within or external to the meter. These developments are advantageous to the utility company in that it reduces the need for employees being dispatched to the remote locations to collect the power consumption information. A standard modem receives raw power consumption information from the power meter and transmits the information to the utility company via telephone lines. While this represents an improvement over past techniques, this information then must be interpreted and further processed to calculate the amount of power consumption, a secondary process that results in further processing apparatus and software, and further resulting in increases to the costs and complexities of the overall system.

There is therefore a need for an electronic power meter that includes improved current inputs to facilitate new installation and/or replacement of such electronic power meters.

There is a further need for an electronic power meter that can be installed in a number of different configurations and/or a number of different wiring schemes.

SUMMARY

In accordance with the present disclosure, electrical devices and electrical power meters are provided. According to an aspect of the present disclosure, an electrical device, includes a housing for containing electrical circuitry therein, the housing including at least one of voltage and current inputs, the housing including passages extending entirely therethrough, wherein the passages are configured to receive a CT lead therethrough; and a face plate operatively supported on a surface of the housing.

The electrical device may further include at least one elongate, electrically conductive plate configured for selective positioning within the passages of the housing. Desirably, each plate includes a first end and a second end extending from the passages of the housing when the plates are positioned therein. In one embodiment, the plates may be fabricated from nickel plated brass.

Desirably, each end of the plate is configured for selective connection of a lug of a CT lead thereto. Alternately, each end of the plate is configured for selective connection of a friction fit connector of a CT lead thereto.

It is envisioned that the through passages may be located along a side of the housing. Desirably, the CT leads are not electrically connected to the electrical circuitry within the housing.

Desirably, the electrical device is configured for ANSI and DIN mounting. The electrical device is capable of connection as at least one of a three-phase, four-wire system wye with direct voltage, 3 element; a three-phase, four-wire system wye with direct voltage, 2.5 element; a three-phase, four-wire wye with PTs, 3 element; a three-phase, four-wire wye with PTs, 2.5 element; a three-phase, three-wire delta with direct voltage; and a three-phase, three-wire delta with PTs.

In one embodiment, at least one of a top surface and a bottom surface of the housing is configured to selectively receive a mounting bracket. The face plate may include at least one of displays, indicators and buttons.

According to another aspect of the present disclosure, an electrical power meter, is disclosed. The electrical power meter includes a housing for containing electrical circuitry therein, the housing including at least one of voltage and current inputs, the housing including passages extending entirely therethrough, wherein the passages are configured to receive a CT lead therethrough, and wherein the CT leads are not electrically connected to the electrical circuitry therein; and a face plate operatively supported on a surface of the housing, wherein the face plate includes at least one of displays, indicators and buttons. It is envisioned that the through passages are located along a side of the housing.

The electrical power meter further includes an elongate, electrically conductive plate configured for selective positioning within the passages of the housing. Desirably, each plate includes a first end and a second end extending from the passages of the housing when the plates are positioned therein. The plates may be fabricated from nickel plated brass.

Desirably, each end of the plate is configured for selective connection of a lug of a CT lead thereto. Alternately, each end of the plate is configured for selective connection of a friction fit connector of a CT lead thereto.

Desirably, the electrical power meter is configured for ANSI and DIN mounting. The electrical power meter is configured for connection as at least one of a three-phase, four-wire system wye with direct voltage, 3 element; a three-phase, four-wire system wye with direct voltage, 2.5 element; a three-phase, four-wire wye with PTs, 3 element; a three-phase, four-wire wye with PTs, 2.5 element; a three-phase, three-wire delta with direct voltage; and a three-phase, three-wire delta with PTs.

Desirably, at least one of a top surface and a bottom surface of the housing is configured to selectively receive a mounting bracket.

According to yet another aspect of the present disclosure, a method of installing an electrical power meter to a panel, in provided. The method includes the steps of providing an electrical power meter. The electrical power meter includes a housing for containing electrical circuitry therein, the housing including at least one of voltage and current inputs, the housing including passages extending entirely therethrough, wherein the passages are configured to receive a CT lead therethrough and wherein the CT leads are not electrically connected to the electrical circuitry therein. The housing is configured for both ANSI and DIN installations. The electrical power meter further includes a face plate operatively supported on a surface of the housing, wherein the face plate includes at least one of displays, indicators and buttons, and mounting means operatively associated with the electrical power meter for securing the electrical power meter to a panel.

The method further includes the steps of inserting a rear end of the housing into an aperture formed in a panel; at least one of passing CT leads through the passages formed in the housing and terminating CT leads to conductive plates disposed in the passages of the housing; and securing the mounting means of the electrical power meter to the panel.

Desirably, the electrical power meter includes at least one elongate, electrically conductive plate configured for selective positioning within the passages of the housing. Each plate includes a first end and a second end extending from the passages of the housing when the plates are positioned therein and configured for selective engagement with CT leads.

In one embodiment, the mounting means of the electrical meter includes threaded rods extending from the face plate and positioned for insertion into corresponding holes formed in the panel. In another embodiment, the mounting means includes brackets selectively engagable with the housing of the electrical meter.

Desirably, the electrical power meter may be configured for connection as at least one of a three-phase, four-wire system wye with direct voltage, 3 element; a three-phase, four-wire system wye with direct voltage, 2.5 element; a three-phase, four-wire wye with PTs, 3 element; a three-phase, four-wire wye with PTs, 2.5 element; a three-phase, three-wire delta with direct voltage; and a three-phase, three-wire delta with PTs.

BRIEF DESCRIPTION OF THE DRAWINGS

The advantages and features of the presently disclosed electrical device, e.g., electronic power meter, will become more readily apparent and may be understood by referring to the following detailed description or illustrative embodiments taken in conjunction with the accompanying drawings, in which.

DETAILED DESCRIPTION OF THE EMBODIMENT

Three-phase power is most commonly used in situations where large amounts of power will be used because it is a more effective way to transmit the power and because it provides a smoother delivery of power to the end load. There are two commonly used connections for three-phase power, a wye connection or a delta connection.

As used herein and as is typical in the art, a "wye connection" is understood to have a phase relation and a winding relationship between the phases which substantially approximates the look of a wye ("Y"). In a wye connection or service, the neutral (or center point of the wye) is typically grounded. This leads to common voltages of 208/120 and 480/277 (where the first number represents the phase-to-phase voltage and the second number represents the phase-to-ground voltage). The three voltages are separated by 120° electrically. Under balanced load conditions with unity power factor, the currents are also separated by 120°.

As used herein and as is typical in the art, a "delta connection" is understood to have load windings which are connected from phase-to-phase rather than from phase-to-ground.

Embodiments of the present disclosure will be described in detail herein below with reference to the accompanying drawings. In the following description, numerous specific details are set forth to provide a more thorough understanding of the present disclosure. It will be apparent, however, to one skilled in the art that the present disclosure may be practiced without these specific details. In other instances, well known functions or constructions have not been described so as not to obscure the present disclosure.

Figure 1:
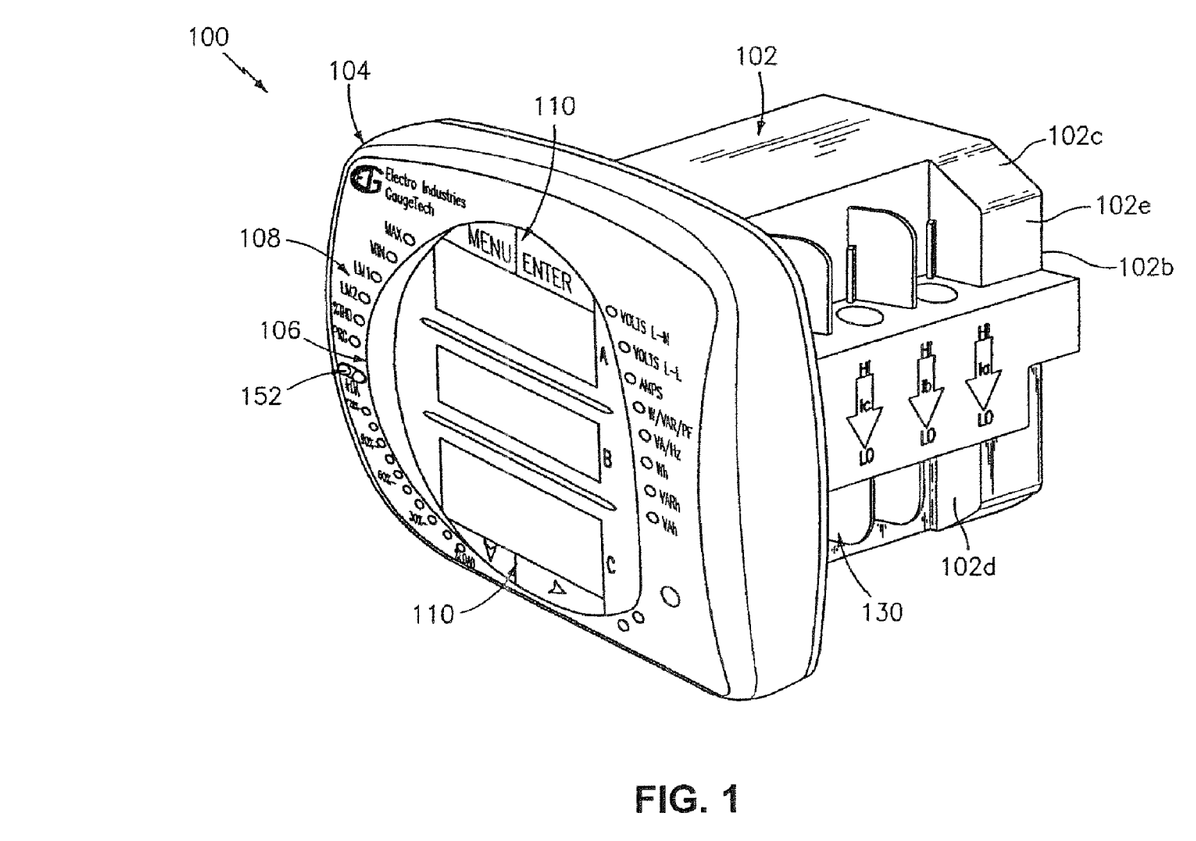
FIG. 1 is a perspective view of an electrical device in accordance with the present disclosure.
Figure 2:
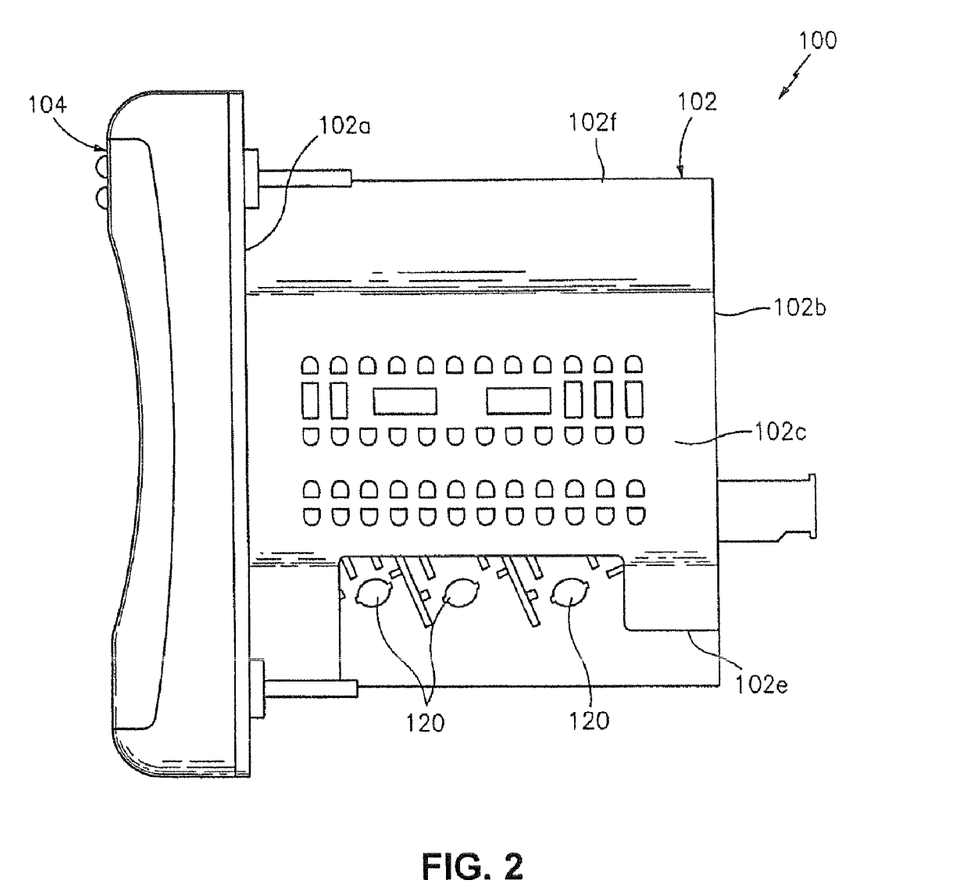
FIG. 2 is a top plan view of the electrical device of FIG. 1.
Figure 3:
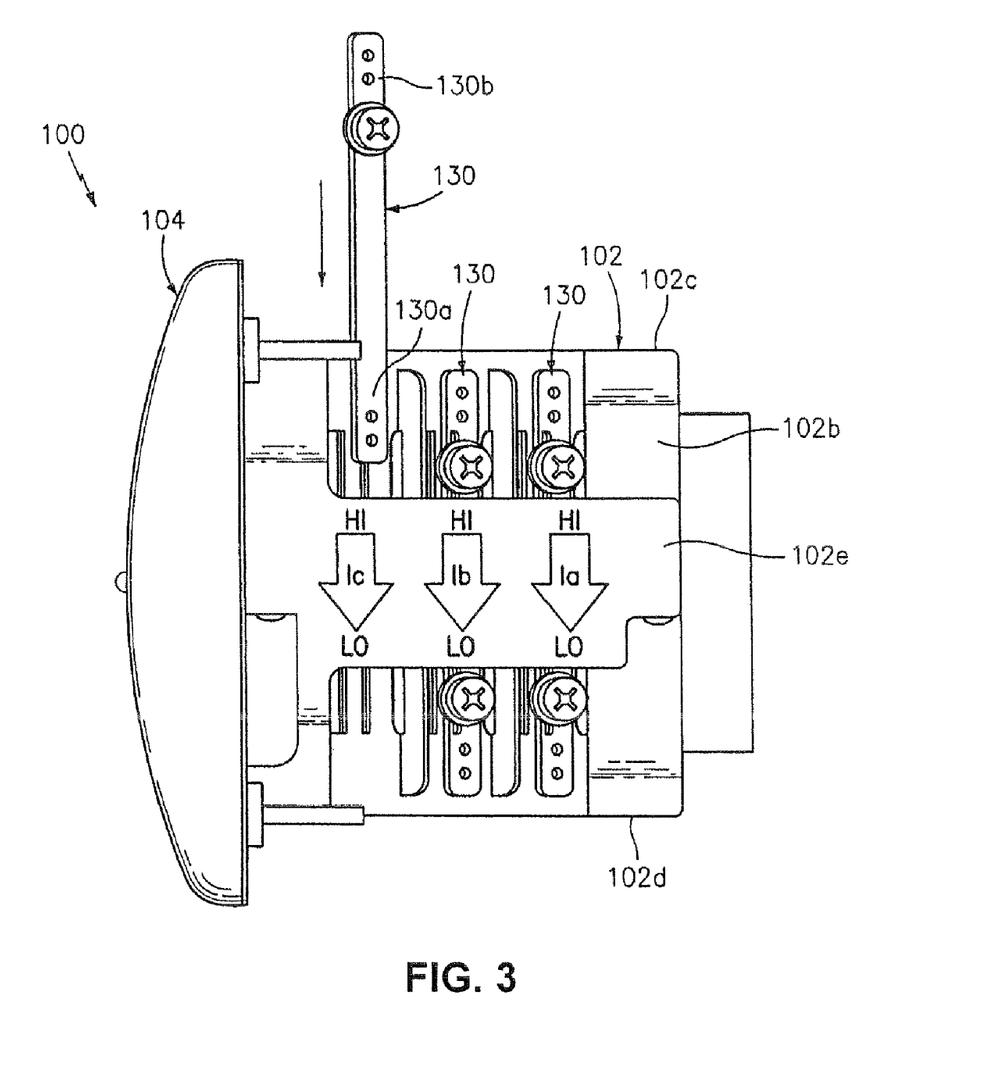
FIG. 3 is a side elevational view of the electrical device of FIGS. 1 and 2.

Referring initially to FIGS. 1-3, an electrical device, e.g., an electronic power meter, in accordance with an embodiment of the present disclosure, is generally designated as 100. As seen in FIGS. 1-3, electrical device 100 includes a housing 102 defining a front surface 102a, a rear surface 102b, a top surface 102c, a bottom surface 102d, a right side surface 102e, and a left side surface 102f. Electrical device 100 includes a face plate 104 operatively connected to front surface 102a of housing 102.

Face plate 104 includes displays 106, indicators 108 (e.g., LEDs and the like), buttons 110, and the like providing a user with an interface for visualization and operation of electrical device 100. For example, as seen in FIG. 1, face plate 104 of electrical device 100 includes analog and/or digital displays 106 capable of producing alphanumeric characters. Face plate 104 includes a plurality of indicators 108 which, when illuminated, indicate to the user the "type of reading", the "% of load bar", the "parameter designation" which indicates the reading which is being displayed on displays 106, a "scale selector" (e.g., Kilo or Mega multiplier of Displayed Readings), etc. Face plate 104 includes a plurality of buttons 110 (e.g., a "menu" button, an "enter" button, a "down" button, a "right" button, etc.) for performing a plurality of functions, including and not limited to: viewing of meter information; enter display modes; configuring parameters; performing resets; performing LED checks; changing settings; viewing parameter values; scrolling parameter values; and viewing limit states.

Figure 5:
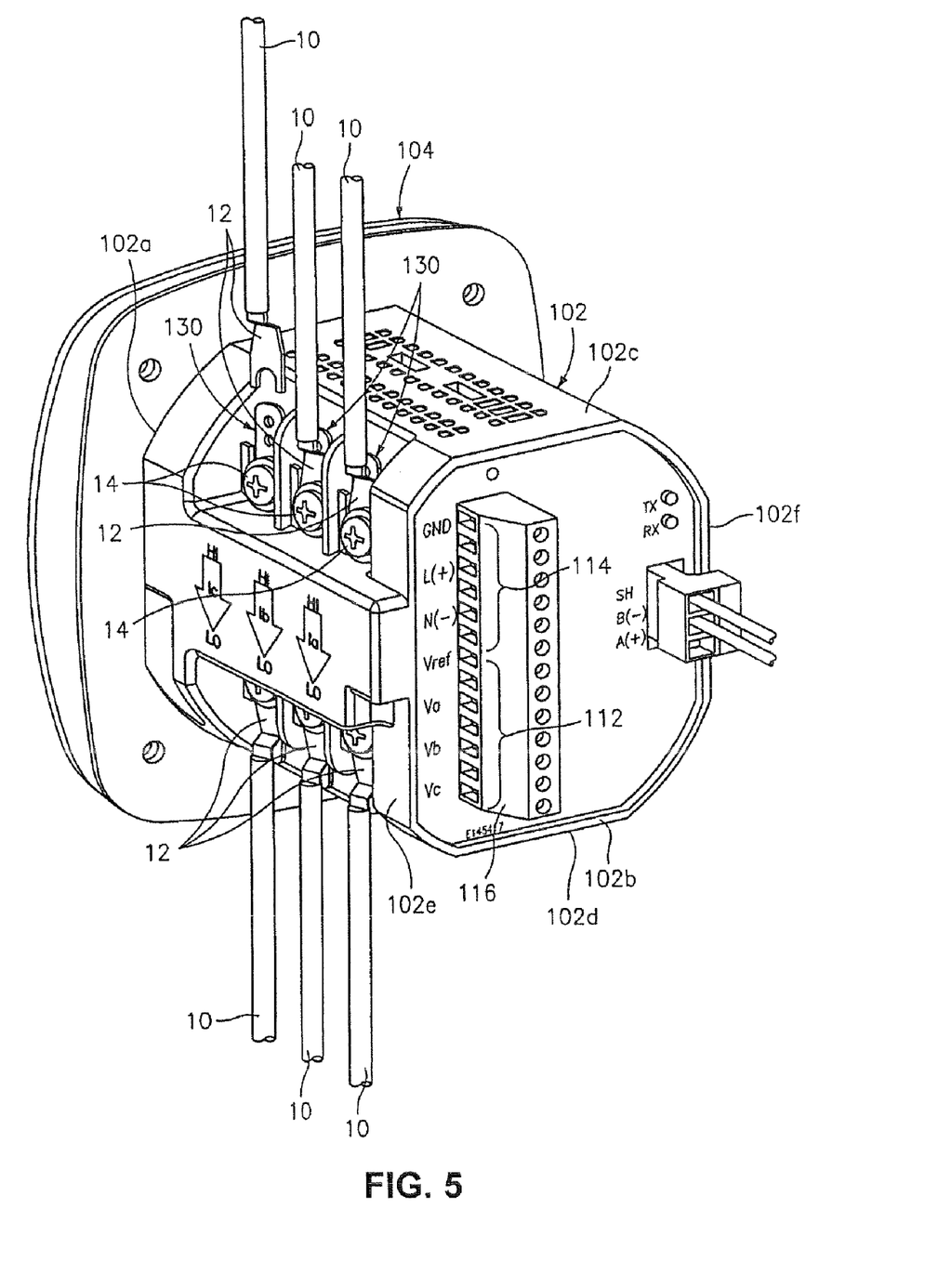
FIG. 5 is a rear perspective view of the electrical device of FIGS. 1-3 illustrating the connection of lead terminals thereto, in accordance with another method of the present disclosure.
Figure 6:
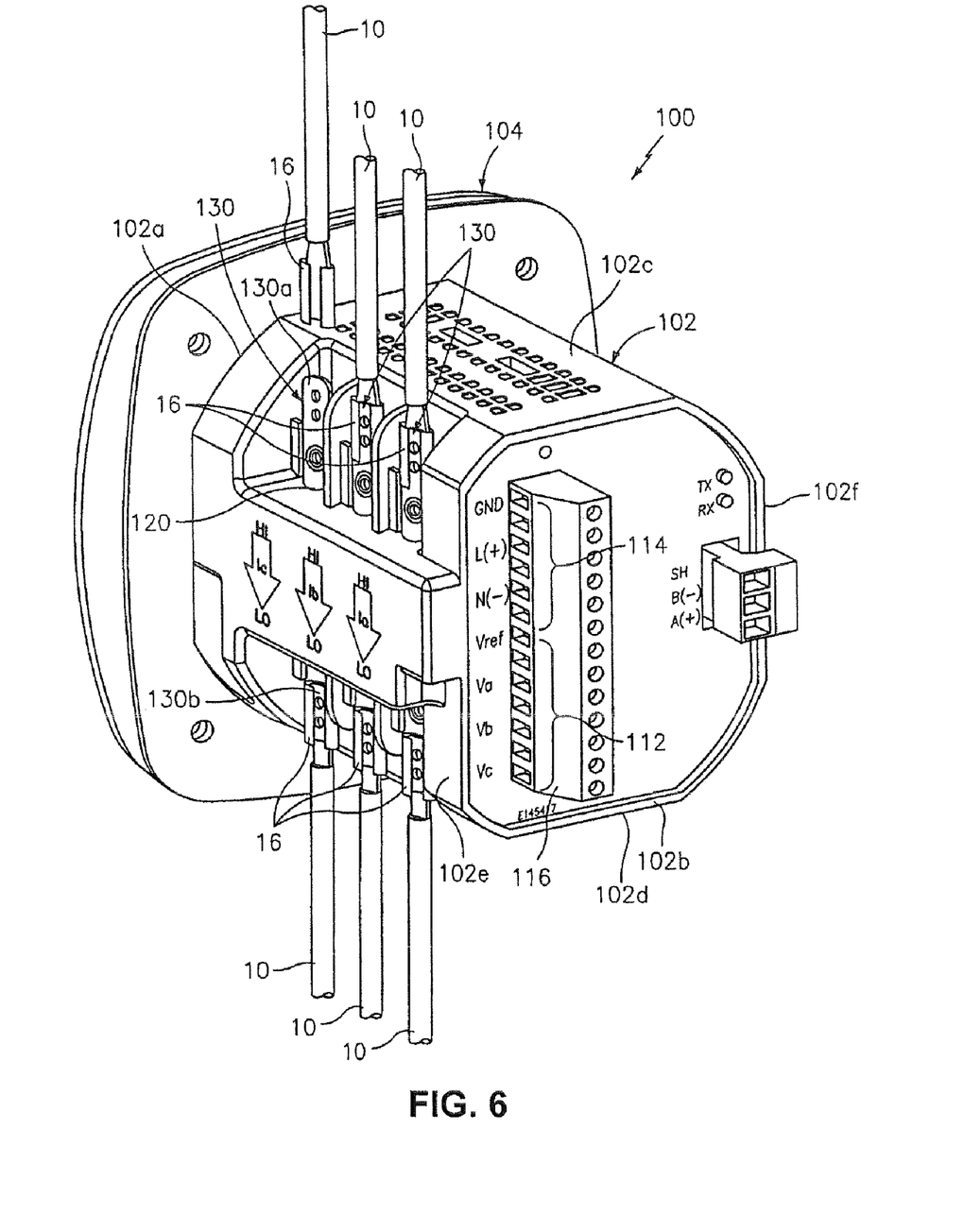
FIG. 6 is a rear perspective view of the electrical device of FIGS. 1-3 illustrating the connection of lead terminals thereto, in accordance with yet another method of the present disclosure.
Figure 7:
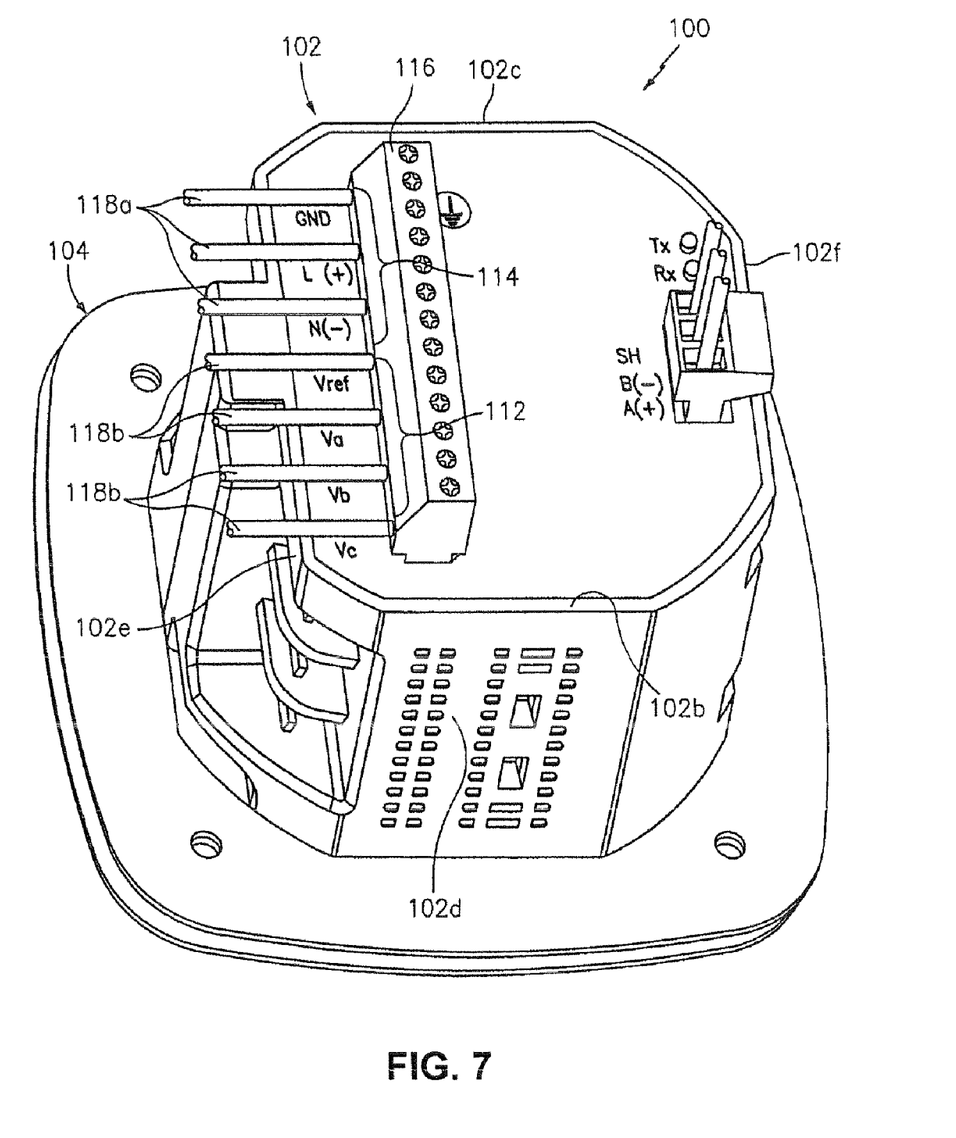
FIG. 7 is a rear perspective view of the electrical device of FIGS. 1-3 illustrating the connection of power supply and voltage inputs thereto, in accordance with a method of the present disclosure.

As seen in FIGS. 4-7, housing 102 includes voltage connections or inputs 112 provided preferably on rear surface 102b thereof, and current inputs 114 provided preferably along right side surface 102e thereof. Desirably, a connector 116 or the like may be used to connect power supply lines 118a and/or voltage supply lines 118b to voltage inputs 112. In particular, as seen in FIG. 7, power supply lines 118a and voltage supply lines 118b are electrically connected to connector 116 which is, in turn, electrically connected to voltage inputs 112. Power supply lines 118a and voltage supply lines 118b are electrically connected to internal components, circuitry and/or printed circuit boards (not shown) of electrical device 100.

As seen in FIG. 2, housing 102 includes a series of pass-throughs or apertures 120 formed along right side surface 102e thereof and extending desirably between top surface 102c and bottom surface 102d thereof. While apertures 120 are shown and described as being formed along right side surface 102e of housing 102 it is envisioned and within the scope of the present disclosure for apertures 120 to be formed along any side of housing 102. As will be described in greater detail below, apertures 120 enable connection of electrical device 100 according to a first method, e.g., a "CT (Current Transformer) Pass Through" method.

As seen in FIG. 3, electrical device 100 may include a plurality of "gills" 130 configured and dimensioned to extend through each aperture 120 of housing 102. Gills 130 are desirably elongate electrically conductive plates or bars having a first end 130a and a second end 130b. As will be described in greater detail below, gills 130 allow for CT leads to be terminated on electrical device 100. Desirably, gills 130 are fabricated from nickel plated brass.

Figure 4:
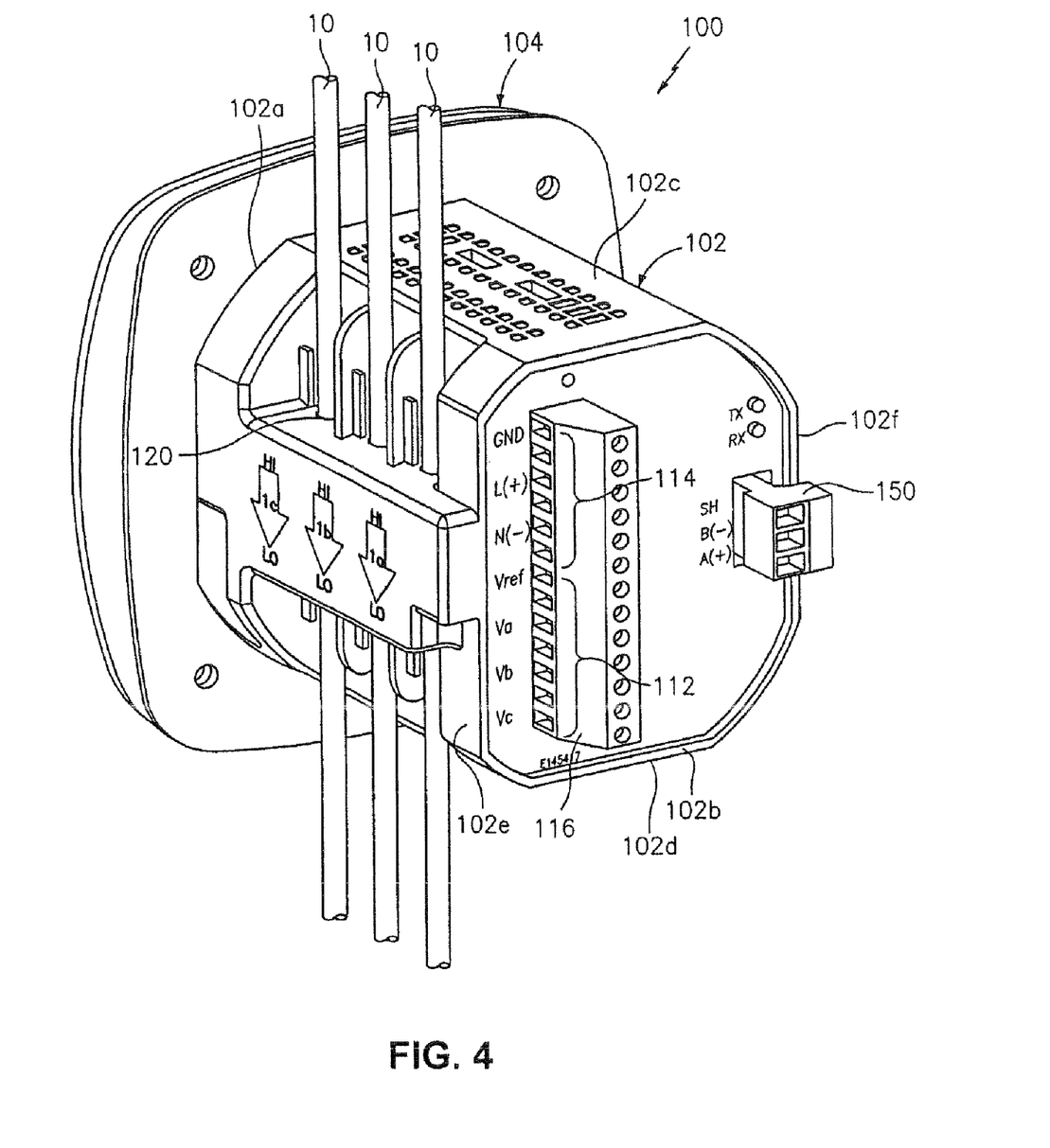
FIG. 4 is a rear perspective view of the electrical device of FIGS. 1-3 illustrating the connection of lead terminals thereto, in accordance with a method of the present disclosure.

Turning now to FIG. 4, a method of connecting electrical device 100 according to the "CT Pass Through" method is shown and described. Connection of electrical device 100 according to the "CT Pass Through" method typically requires passage of CT lead(s) 10 through apertures 120 of housing 102. Accordingly, CT lead(s) 10 pass directly though electrical device 100 without any physical termination on electrical device 100. Extending CT leads 10 to electrical device 100 according to the "CT Pass Through" method insures that electrical device 100 cannot be a point of failure on the circuit.

Turning now to FIG. 5, an alternate method of connecting electrical device 100 is shown and described. As seen in FIG. 5, gills 130 have been inserted into apertures 120 formed in housing 102. Desirably, first ends 130a of gills 130 are exposed along top surface 102c of housing 102 and second ends 130b of gills 130 are exposed along bottom surface 102d of housing 102. In this manner, CT leads 10 may be electrically connected to first ends 130a of gills 130 and/or second ends 130b of gills 130. Desirably, CT leads 10 are provided with an "O" or "U" lug 12 at a free end thereof for terminating CT leads 10 to gills 130. For example, a screw 14 or the like may be used to connect lug 12 of CT lead 10 to gill 130. As seen in FIG. 5, by terminating CT leads 10 to gills 130 of electrical device 100, the possibility of a point of failure occurring at electrical device 100 is eliminated.

As seen in FIG. 6, according to an alternate method, lugs 12 may be replaced by friction fit quick connectors 16. Accordingly, in use, CT leads 10 may be terminated and/or electrically connected to gills 130 by sliding quick connectors 16 over the tips of first and second ends 130a, 130b of gills 130.

In each of the embodiments above, CT leads 10 either extend through housing 102 of electrical device or terminate on gills 130 which are un-connected to any electrical component of electrical device 100. Unlike the embodiments disclosed herein, other electrical device (e.g., electrical meters) utilize terminal blocks to pass the current, traveling through the CT leads, through a soldered connection on a printed circuit board. Accordingly, the prior art electrical devices may be susceptible to burn-out or failure in the event of a surge in current through the CT leads.

Figure 8A:
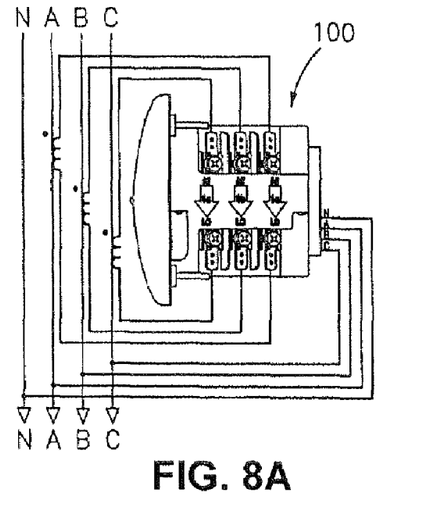
FIGS. 8A-8F illustrate several exemplary electrical connection diagrams for the electrical device of FIGS. 1-3.
Figure 8B:
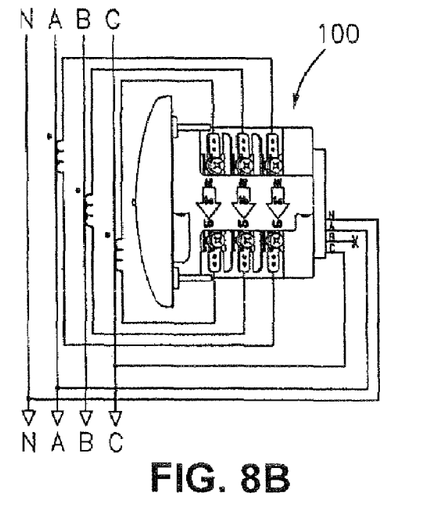
Figure 8C:
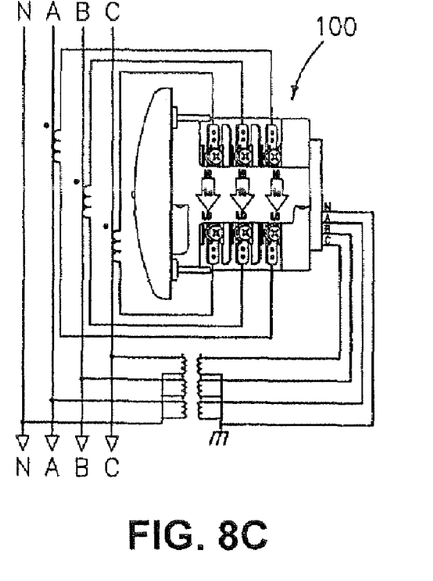
Figure 8D:
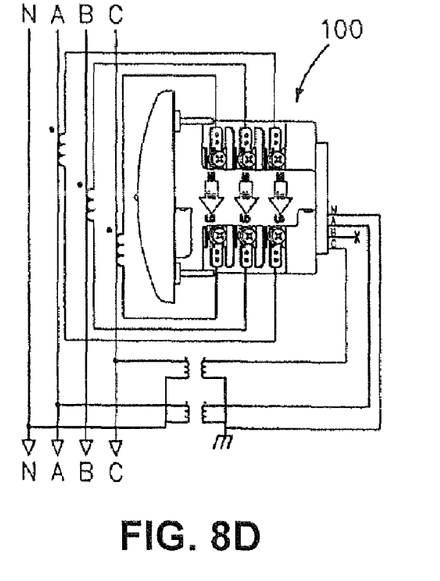
Figure 8E:
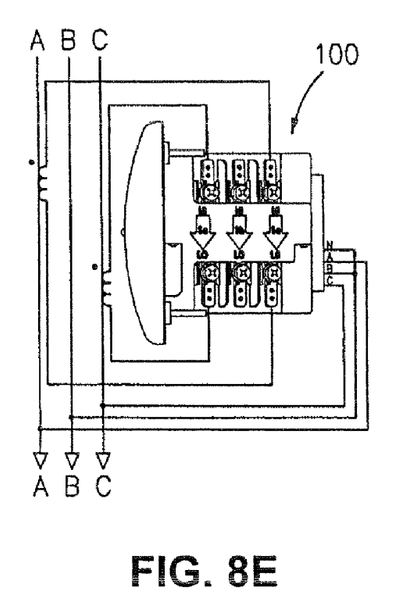
Figure 8F:
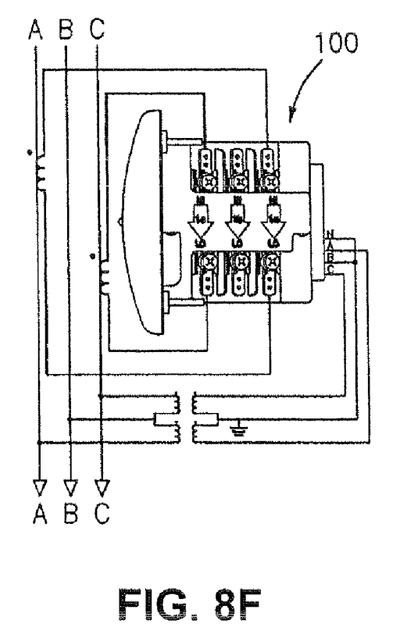

Turning now to FIGS. 8A-8F, various electrical connection diagrams for the connection of electrical device 100, are shown and described. With reference to FIG. 8A, a connection diagram for a three-phase, four-wire system wye with direct voltage, 3 element, is shown. With reference to FIG. 8B, a connection diagram for a three-phase, four-wire system wye with direct voltage, 2.5 element, is shown. With reference to FIG. 8C, a connection diagram for a three-phase, four-wire wye with PTs ("Potential Transformers"), 3 element, is shown. With reference to FIG. 8D, a connection diagram for a three-phase, four-wire wye with PTs ("Potential Transformers"), 2.5 element, is shown. With reference to FIG. 8E, a connection diagram for a three-phase, three-wire delta with direct voltage, is shown. With reference to FIG. 8F, a connection diagram for a three-phase, three-wire delta with PTs, is shown.

Electrical device 100 may include a digital sampler for sampling a voltage and a current at a sampling point, and a processor for processing at least one of the sampled voltage and the sampled current. Exemplary embodiments of a digital sample and processor are disclosed in U.S. Pat. No. 6,751,563, the entire contents of which are incorporated herein by reference.

Electrical device 100 may include an auto-calibration feature and a data acquisition node for measuring the power usage and power quality of electrical power in an electrical power distribution network. Exemplary embodiments of an auto-calibration feature and a data acquisition node are disclosed in U.S. Pat. No. 6,735,535, the entire contents of which are incorporated herein by reference.

Figure 11A:
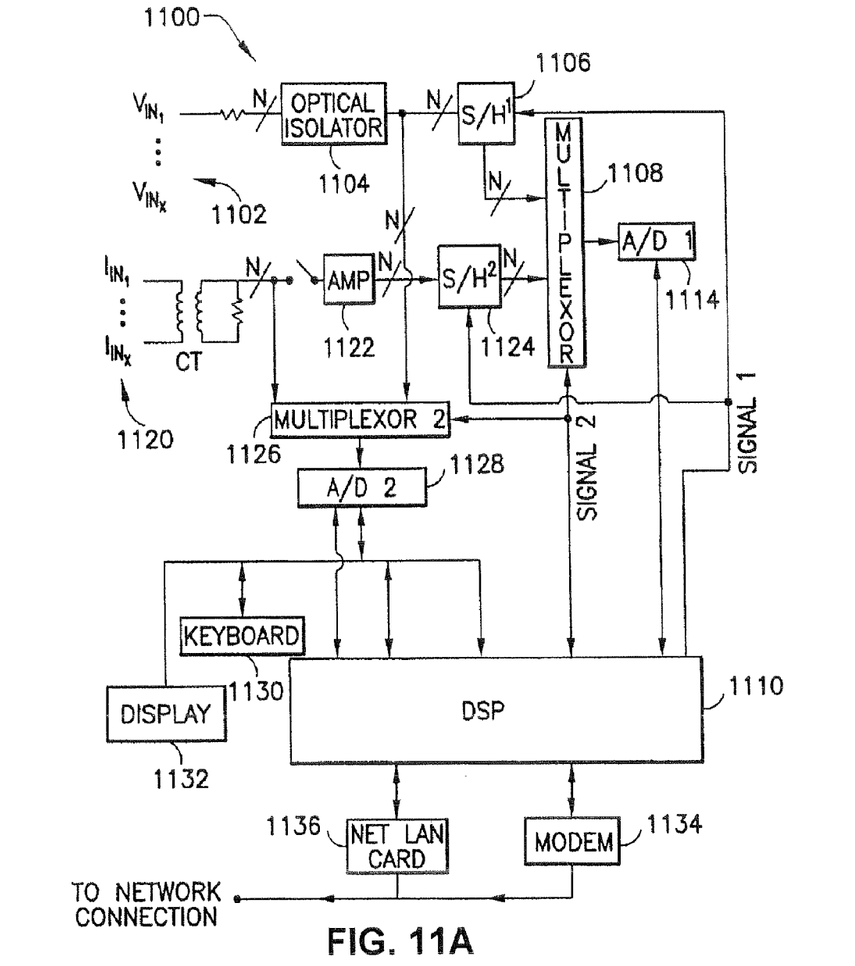
FIG. 11A is a diagram of a power meter according to the present invention.

Portions of U.S. Pat. No. 6,735,535 will be reproduced here. Referring to FIG. 11A, there is shown an exemplary diagram of a power meter for calibrating voltage and current inputs according to the principles of the present invention. The power meter is designated generally by reference numeral 1100 and includes a plurality of voltage input lines 1102, Vin, for receiving N voltage inputs which are optically isolated by a respective optical isolator 1104, as known in the art, to protect the power meter 1100. The N voltage inputs are received from the respective optical isolators 1104 by a respective sample and hold circuitry 1106 (S/H 1). Based on a control signal, the N voltage outputs of the respective sample and hold circuitry 1106 are transmitted to a first multiplexor 108. The first multiplexor 1108 receives a control signal (SIGNAL 2) from a DSP 1110 to output at least one of the N voltage outputs received from the respective sample and hold circuitry 1106. The voltage output from the first multiplexor 1108 is received by a first analog-to-digital converter 1114 which converts the analog voltage output signal to a digital voltage signal. The digital voltage signal is subsequently transmitted to the DSP 1110.

The power meter 1100 also includes a plurality of current input lines 1120, Iin, which receive N current inputs which are sampled through respective current transformers CT. The N current inputs are transmitted to a respective amplifier 1122 and then to respective sample and hold circuitry 1124 (S/H 2). Based on control signal (SIGNAL 1), the sample and hold circuitry 1124 transmits the N current inputs to the first multiplexor 1108. Subsequently, based on control signal (SIGNAL 2), the first multiplexor 1108 outputs a current output to the first analog-to-digital converter 1114, which is subsequently transmitted to the DSP 1110.

The N voltage inputs and N current inputs are also received by a second multiplexor 1126 and at least one voltage input and at least one current input are transmitted to a second analog-to-digital converter 1128 based on the control signal (SIGNAL 2). The outputs from the second analog-to-digital converter 1128 are transmitted to the DSP 1110. The DSP 1110 is connected to peripherals, such as a keyboard 1130, a display 1132, a modem 1134, and a network card interface 1136 for communicating with the power meter 1100 from a remote station (not shown), preferably through a network connection.

The digital representation of each of the N voltage and N current inputs is processed and stored within the DSP 1110. The DSP 1110 includes at least a random access memory (RAM) and a read only memory (ROM).

Figure 11B:
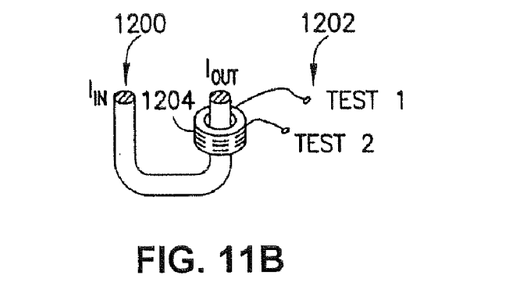
FIG. 11B illustrates a coupling device of the power meter of FIG. 11 for coupling the power meter to an electrical power line to protect the power meter from excessive current.

Referring to FIG. 11B, there is shown a coupling device for sampling the N current inputs while protecting the power meter 1100 from excessive current. The input and output currents Iin, Iout are connected via a U-shaped metal rod 1200, which is preferably ¼ inch thick, that bears current for the input current signal Iin. The current of the input current signal In is measured via a toroid sensor 1202 attached to a toroid 1204. The toroid 1204 is implemented to preferably convert the input current to a proportional voltage. The U-shaped metal rod 1200 traverses through the toroid 1204 for the input current signal Iin, as noted above. The metal rod 1200 also acts as a primary winding having a single turn and the toroid 1204 acts as the secondary winding. The toroid 1204 preferably contains approximately 1000 turns.

Electrical device 100 may be a revenue grade meter having high speed transient detection, such as the meter disclosed in U.S. Pat. No. 6,636,030, the entire contents of which are incorporated herein by reference.

Electrical device 100 is configured and dimensioned for installation using a standard ANSI C39.1 (4" round) or an IEC 92 mm DIN (Square) form.

Figure 9A:
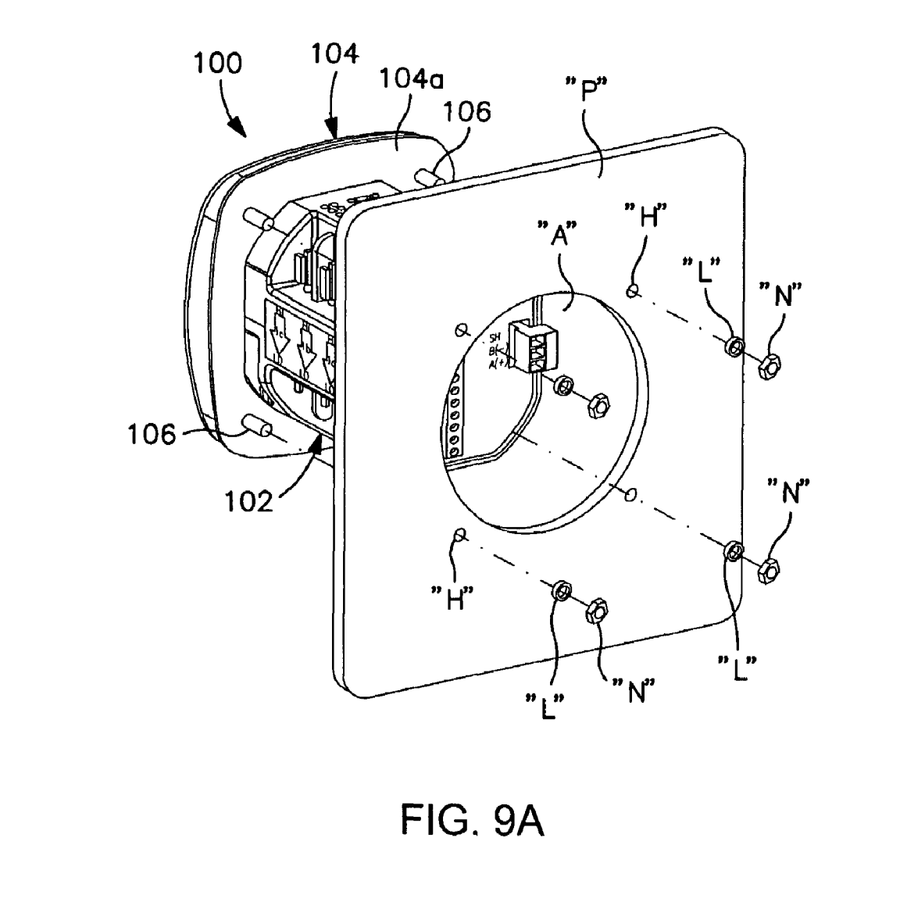
FIGS. 9A and 9B illustrate an ANSI installation of the electrical device of FIGS. 1-3.
Figure 9B:
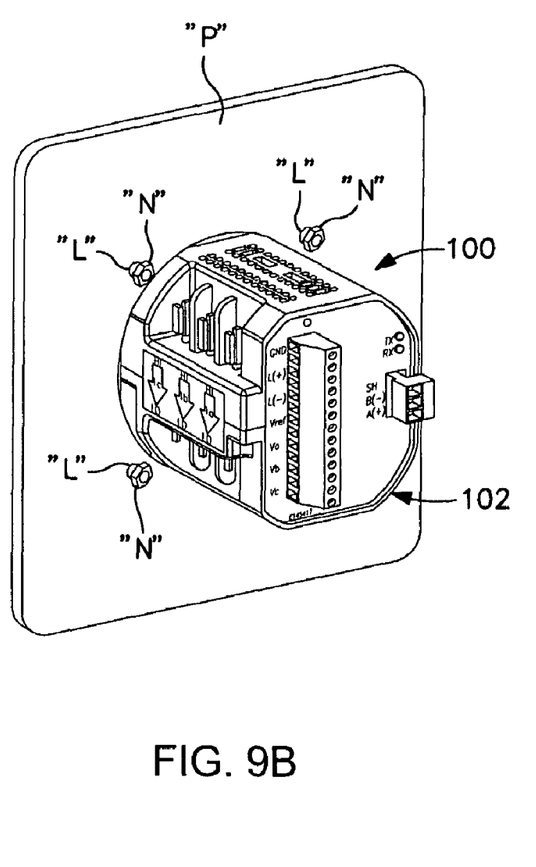

FIGS. 9A and 9B illustrate and describe a method of installing electrical device 100 according to ANSI standards. As seen in FIGS. 9A and 9B, face plate 104 includes mounting means in the form of a plurality of threaded rods 106 extending from a rear surface 104a thereof. Electrical device 100 is inserted into an opening or aperture "A" of panel "P" such that threaded rods 106 extend through holes "H" formed in panel "P". Electrical device 100 is secured to panel "P" by tightening a lock washer "L" and nut "N" onto each threaded rod 106. Preferably, a mounting gasket "G" is disposed in rear surface 104a of face plate 104 prior to the mounting of electrical device 100 to panel "P".

Figure 10A:
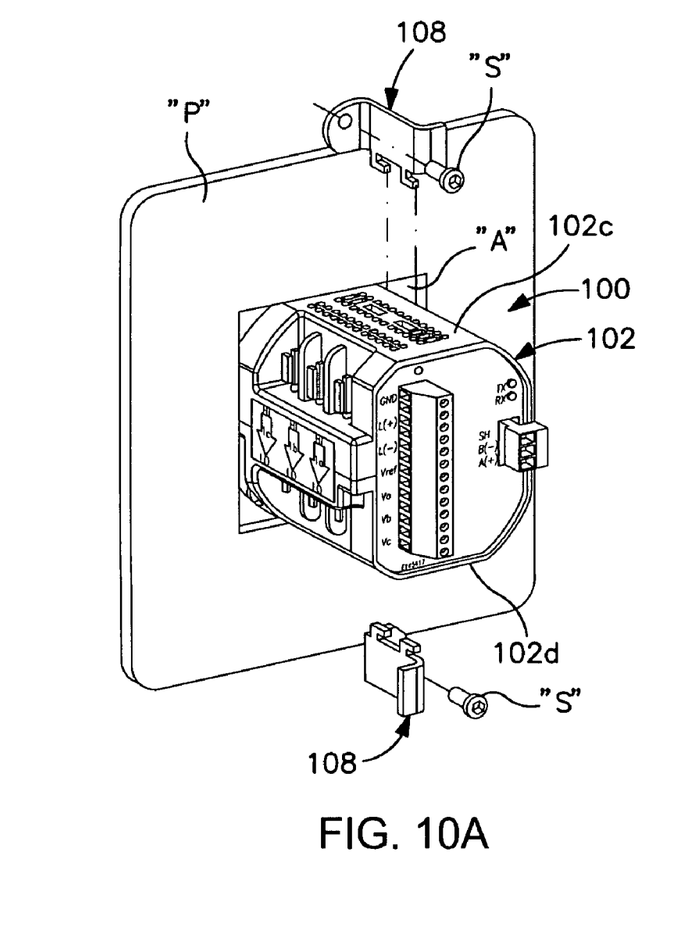
FIGS. 10A and 10B illustrate a DIN installation of the electrical device of FIGS. 1-3.
Figure 10B:
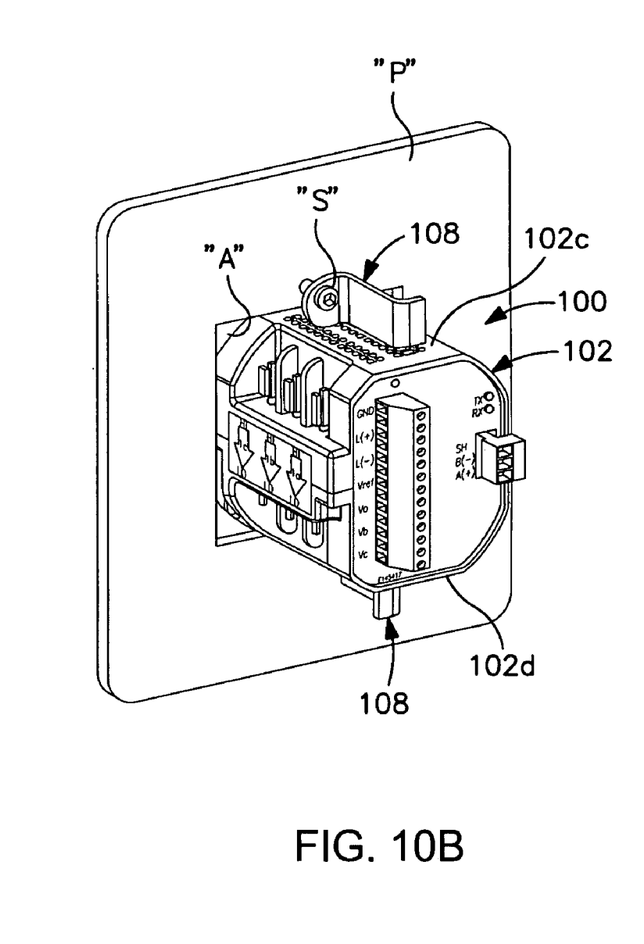

FIGS. 10A and 10B illustrate and describe a method of installing electrical device 100 according to DIN standards. As seen in FIGS. 10A and 10B, electrical device 100 is inserted into opening or aperture "A" of panel "P" and mounting means, in the form of mounting brackets 108, are operatively connected to top surface 102c and bottom surface 102d of housing 102. Electrical device 100 is then secured to panel "P" using screws "S" extending through mounting brackets 108 and engaging the surface of panel "P".

Turning back to FIG. 4, electrical device 100 may include a first interface or communication port 150 for connection to a master and/or slave device. Desirably, first communication port 150 is situated in rear surface 102b of housing 102. Electrical device 100 may also include a second interface or communication port 152 situated on face plate 104 (see FIG. 1).

While the disclosure has been particularly shown and described with reference to a preferred embodiment, it will be understood by those skilled in the art that various modifications in form and detail may be made therein without departing from the scope or spirit of the disclosure. Accordingly, modifications, such as those suggested above, but not limited thereto are to be considered within the scope of the presently disclosed electrical device.

What is claimed is:

1. An electrical power meter comprising:
   a housing for containing electrical circuitry for measuring power usage therein, the electrical circuitry including a digital sampler configured for sampling at least one voltage waveform and at least one current waveform and a processor configured to generate power consumption information from the at least one voltage and current waveforms;
   wherein the housing includes at least one voltage input and at least one current input coupled to the digital sampler, the at least one current input being configured as at least one passage extending entirely through the housing, wherein the at least one passage is configured to receive at least one CT lead therethrough, and wherein said at least one CT lead extends through the at least one passage of the housing un-connected to any electrical component of said electrical circuitry for measuring power usage.

2. The electrical power meter according to claim 1, further comprising a first interface disposed on the housing for connection to a master and/or a slave device.

3. The electrical power meter according to claim 2, further comprising a second interface disposed on the housing for communicating to another device.

4. The electrical power meter according to claim 1, further comprising a face plate operatively supported on a surface of the housing, wherein the face plate includes at least one of displays, indicators and buttons.

5. The electrical power meter according to claim 4, further comprising a communication interface disposed on the face plate.

6. The electrical power meter according to claim 5, wherein the communication interface is a wireless communication port.

7. The electrical power meter according to claim 5, further comprising a second communication interface disposed on a surface of the housing other than the face plate.

8. The electrical power meter according to claim 7, wherein the second communication interface is a network card interface.

9. The electrical power meter according to claim 7, wherein the second communication interface is a modem.

10. The electrical power meter according to claim 4, wherein the housing is generally rectangular and defines a front and rear surface, a top and bottom surface and a right and left surface, wherein the face plate is disposed on the front surface.

11. The electrical power meter according to claim 10, further comprising a first communication interface disposed on the face plate and a second communication interface disposed on the rear surface.

12. The electrical power meter according to claim 1, further comprising at least one elongate, electrically conductive plate configured for selective positioning within the at least one passage of the housing, wherein each plate includes a first end and a second end extending from the at least one passage of the housing when the plates are positioned therein.

13. The electrical power meter according to claim 12, wherein each end of the at least one plate is configured for selective connection of a lug of a CT lead thereto.

14. The electrical power meter according to claim 1, wherein the electrical power meter is configured for connection as at least one of a three-phase, four-wire system wye with direct voltage, 3 element; a three-phase, four-wire system wye with direct voltage, 2.5 element; a three-phase, four-wire wye with PTs, 3 element; a three-phase, four-wire wye with PTs, 2.5 element; a three-phase, three-wire delta with direct voltage; and a three-phase, three-wire delta with PTs.

15. The electrical power meter according to claim 1, wherein the housing is configured for ANSI and DIN mounting.

16. An electrical power meter comprising:

a housing for containing electrical circuitry for measuring power usage therein, the electrical circuitry including a digital sampler configured for sampling at least one voltage waveform and at least one current waveform and a processor configured to generate power consumption information from the at least one voltage and current waveforms;

a display that provides a visual indication utilizing at least three lines of measured parameters;

a first communication port to provide the measured and generated information over a network;

wherein the housing includes at least one voltage input and at least one current input coupled to the digital sampler, the at least one current input being configured as at least one passage extending entirely through the housing, wherein the at least one passage is configured to receive at least one CT lead therethrough, and wherein said at least one CT lead extends through the at least one passage of the housing un-connected to any electrical component of said electrical circuitry for measuring power usage.

17. The electrical power meter according to claim 16, further comprising at least one elongate, electrically conductive plate configured for selective positioning within the at least one passage of the housing, wherein each plate includes a first end and a second end extending from the at least one passage of the housing when the plates are positioned therein.

18. The electrical power meter according to claim 17, wherein the elongate plate has terminations for current transformer inputs.

19. The electrical power meter according to claim 17, wherein the display includes light emitting diodes and s second front mounted communication port.

20. The electrical power meter according to claim 19, wherein the second communication port is wireless.

* * * * *